United States Patent [19]
Sakai et al.

[11] Patent Number: 4,737,824
[45] Date of Patent: Apr. 12, 1988

[54] SURFACE SHAPE CONTROLLING DEVICE

[75] Inventors: Fumio Sakai, Kawasaki; Junji Isohata, Tokyo, both of Japan

[73] Assignee: Canon Kabushiki Kaisha, Tokyo, Japan

[21] Appl. No.: 786,077

[22] Filed: Oct. 10, 1985

[30] Foreign Application Priority Data

| Oct. 16, 1984 | [JP] | Japan | 59-215146 |
| Oct. 16, 1984 | [JP] | Japan | 59-215147 |
| Oct. 16, 1984 | [JP] | Japan | 59-215148 |
| Oct. 16, 1984 | [JP] | Japan | 59-215149 |

[51] Int. Cl.⁴ ............................................. G03B 27/42
[52] U.S. Cl. ..................................... 355/53; 355/73; 355/91
[58] Field of Search ................ 355/18, 45, 55, 53, 355/76, 77, 79, 91, 132, 94, 92, 72, 73

[56] References Cited

U.S. PATENT DOCUMENTS

| 3,320,867 | 5/1967 | Miller | 355/92 |
| 3,834,815 | 9/1974 | Grieg | 355/91 |
| 4,054,383 | 10/1977 | Lin et al. | 355/91 |
| 4,218,136 | 8/1980 | Komoriya et al. | 355/91 X |
| 4,298,273 | 11/1981 | Nishizuka et al. | 355/53 X |
| 4,576,475 | 3/1986 | Kitagawa et al. | 355/91 |

FOREIGN PATENT DOCUMENTS

| 57-87129 | 5/1982 | Japan. |
| 57-177536 | 11/1982 | Japan. |
| 0669316 | 6/1979 | U.S.S.R. ............ 355/73 |

Primary Examiner—L. T. Hix
Assistant Examiner—D. Rutledge
Attorney, Agent, or Firm—Fitzpatrick, Cella, Harper & Scinto

[57] ABSTRACT

A device for controlling the shape of a surface of a plate-like member such as a semiconductor wafer, includes support for supporting the plate-like member from a reverse surface thereof, a holding system for holding a portion of the reverse surface of the plate-like member on the support, and a control for controlling a pressure in a closed space which is related, when the plate-like member is supported by the support, to a portion of the reverse surface of the plate-like member other than the first-mentioned portion, such that the pressure in the closed space is changeable to be increased or decreased as compared with an initial pressure in the closed space when the plate-like member is supported by the support, to control deformation of the plate-like member to thereby control the surface shape of the plate-like member.

7 Claims, 4 Drawing Sheets

SURFACE SHAPE CONTROLLING DEVICE

FIELD OF THE INVENTION AND RELATED ART

This invention relates to a surface shape controlling device and, more particularly, to a device for controlling the shape (including flatness or non-flatness) of a surface of a semiconductor wafer to bring the wafer surface into a predetermined relation with a plane in which an image of a circuit pattern of a photomask or reticle (which hereinafter "mask"), to be printed on the wafer for the manufacture of semiconductor devices, is formed.

In the field of manufacture of microcircuits such as integrated circuits, many kinds of exposure apparatuses for exposing the semiconductor wafer to the circuit pattern of the mask have been developed. In such exposure apparatuses and when the circuit pattern of the mask is to be transferred onto the wafer, e.g. through a projection optical system, at a unit magnification or on a reduced scale, the wafer is held fixedly by vacuum suction on a flat holding surface of a wafer chuck so that the wafer follows the flat chuck surface to preclude any focus deviation between the wafer surface and a plane in which the image of the circuit pattern of the mask is formed. This technique requires exact flatness of the wafer holding surface of the wafer chuck. In addition, it is necessary to control the flatness against temperature variation or the like. Therefore, an increased manufacturing cost and complicated maintenance are required.

The above-described method of vacuum-chucking relative to the whole surface of the wafer involves another problem. Practically, with this method, the wafer does not always exactly follow the flat holding surface of the wafer chuck. This is because of unevenness in the vacuum suction forces applied to various portions of the wafer. Also, it is difficult to apply the vacuum suction forces to various portions of the wafer at exactly the same timing.

In order to alleviate these problems, it has been proposed in Japanese Laid-Open Patent Applications, Laid-Open Nos. 87129/1982 and 177536/1982 to adjust the vacuum suction forces, to be applied to various portions of the wafer, independently from each other.

With the vacuum-chucking method, however, it is difficult to correct the shape or contour of the wafer surface if the wafer is warped into a concave shape, although the correction will be relatively easy where the wafer is warped into a convex shape.

In another aspect, a larger area of contact between the wafer and the wafer chuck leads to a higher possibility of capturing foreign particles between the wafer and the wafer chuck. If any foreign particle is left between the wafer and the wafer chuck, the portion of the wafer riding on the foreign particle is deformed upwardly, which results in an undesired focusing error.

In a still further aspect, it is possible that the focal plane defined by the projection optical system of the exposure apparatus deviates from the wafer surface. That is, it is possible that the best focal plane of the projection optical system is not exactly flat. In such a case, with the above-described vacuum-chucking technique, the surface shape of the wafer can not be controlled so as to be exactly coincident with the focal plane.

SUMMARY OF THE INVENTION

It is accordingly a primary object of the present invention to provide a surface shape controlling device capable of accurately and quickly controlling, particularly flattening, the surface of a plate-like member such as a wafer, irrespective of whether the plate-like member is warped convexly or concavely.

It is another object of the present invention to provide a surface shape controlling device which minimizes the possibility of unwanted deformation of a plate-like member being treated, due to any foreign particle captured between the platelike member and the surface shape controlling device.

It is a further object of the present invention to provide a surface shape controlling device by which the whole surface of a semiconductor wafer can be placed exactly in a plane in which an image of a circuit pattern of a mask is formed.

Briefly, according to the present invention, there is provided a device for controlling the shape of a surface of a plate-like member, the device comprising means for supporting the plate-like member from a reverse surface thereof, means for holding a portion of the reverse surface of the plate-like member on the supporting means, and means for controlling a pressure in a closed space which is related, when the plate-like member is supported by the supporting means, to a portion of the reverse surface of the plate-like member other than the first-mentioned portion, such that the pressure in the closed space is changeable to be increased or decreased as compared with an initial pressure in the closed space when the plate-like member is supported by the supporting means, to control deformation of the plate-like member to thereby control the surface shape of the plate-like member.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
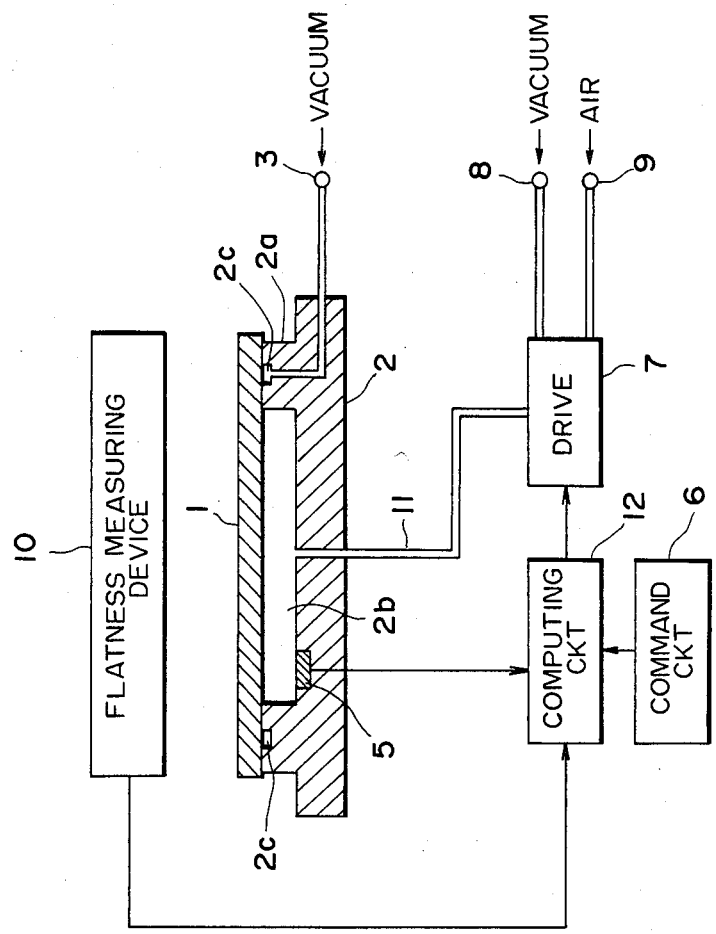
FIG. 1 is a sectional view schematically and diagrammatically showing a surface shape controlling device according to an embodiment of the present invention.

Referring first to FIG. 1, there is shown a wafer chuck, for use in a semiconductor device manufacturing exposure apparatus, in which a surface shape controlling device according to one embodiment of the present invention is incorporated.

In FIG. 1, denoted by reference numeral 1 is a semiconductor wafer onto which a circuit pattern of an unshown mask is to be transferred by means of an unshown projection optical system. A wafer chuck base 2 has an upwardly extending annular support 2a which is formed at a peripheral portion of an upper surface of the base 2, so that a circular recess 2b (which hereinafter "pocket") is defined inside the support 2a. The support 2a is adapted to support a peripheral portion of the wafer 1, from a reverse side thereof, when it is placed on the wafer chuck.

A wafer chucking vacuum groove 2c is formed on the top of the support 2a and extends circumferentially along the support 2a. The vacuum groove 2c is communicated via a vacuum tube 3 with a vacuum source (vacuum pump) which is schematically illustrated in FIG. 1 by the legend "VACUUM". When the wafer 1 is placed on and supported by the support 2a, vacuum is supplied from the vacuum source to the vacuum groove 2c via the tube 3, so that the wafer is held on the wafer chuck by vacuum suction force.

When the wafer 1 is held on the support 2a, the upper opening of the pocket 2b is closed by a mid portion of the wafer 1, so that a closed space or chamber is defined between the wafer 1 and the wafer chuck base 2. The pocket 2b communicates via a tube 11 with a drive unit 7. The drive unit 7 communicates via a tube 8 with a vacuum source (vacuum pump), which is schematically illustrated by the legend "VACUUM", and also communicated via a tube 9 with an air pressure source (air pressure pump) which is schematically illustrated by the legend "AIR". The drive unit 7 includes a servo valve system composed of a valve operable in response to an electrical signal, a nozzle, an ON/OFF switch, etc., and is adapted to supply a controlled vacuum or air pressure (pressurized air) to the pocket 2b, in accordance with an instruction signal produced by a computing circuit 12 which will be described later.

The surface shape controlling device further includes a pressure sensor 5 for detecting the pressure in the closed space defined by the pocket 2b and the wafer 1. An output of the pressure sensor 5 is applied to the computing circuit 12. A command circuit 6 is connected to the computing circuit 12 to supply thereto an instruction signal designating or setting a desired surface shape of the wafer 1. A flatness measuring device 10 of known type is provided to detect the flatness or nonflatness of the wafer 1 surface. The flatness measuring device 10 may be of an air-microsensor type, electrostatic capacitance type or displacement gauge type having laser interferometers. The flatness measuring device 10 is arranged to measure, at plural points, the distance to the wafer 1 surface to thereby detect the flatness or nonflatness of the wafer 1 surface. An output of the flatness measuring device 10 is applied to the computing circuit 12. The computing circuit 12 is arranged to compare the output of the flatness detecting device 10, indicating the current flatness (nonflatness) of the wafer 1 surface, with the output of the command circuit 6 indicating the desired surface shape of the wafer and to produce an electrical signal corresponding to the difference therebetween and specifying the operation of the drive unit 7. The output signal of the computing circuit 12 is supplied to the drive unit 7.

When, in operation, the wafer 1 is placed on the wafer chuck base 2, vacuum is applied via the tube 3 to the vacuum groove 2c, whereby the peripheral portion of the wafer 1 is fixedly held by vacuum suction on the support 2a of the wafer chuck base 2. By this, a pressure-controllable closed space or chamber is defined between the pocket 2b and the wafer 1. The initial pressure in the closed chamber (pocket 2b) is equal to the atmospheric pressure. After the wafer 1 is held on the wafer chuck base 2, the flatness measuring device 10 detects the surface shape (flatness or nonflatness) of the wafer 1 surface, and the output of the flatness detecting device 10 is supplied to the computing circuit 12. Simultaneously therewith, the command circuit 6 supplies to the computing circuit 12 an electrical signal designating the set or desired surface shape of the wafer 1 surface. The computing circuit 12 compares the output of the flatness detecting device 10 with the output of the command circuit 6 and computes the difference therebetween. The drive unit 7 controls, in accordance with the output of the computing circuit 12, the supply of vacuum to the pocket 2b from the tube 8 or the supply of air pressure to the pocket 2b from the tube 9, to thereby change (increase or decrease), the pressure within the closed space or pocket 2b. As a result, the mid portion of the wafer 1 facing to the pocket 2b deforms upwardly or downwardly, such that the surface of the wafer 1 is flatened or warped convexly or concavely. By repeating in a negative feedback manner the surface shape control which comprises the control of the pressure in the pocket 2b with or without measurement of the flatness, the surface shape of the wafer 1 is corrected as designated by the command circuit 6.

Where the surface shape controlling device of FIG. 1 is incorporated into a semiconductor device manufacturing exposure apparatus, it is difficult to measure, with the flatness measuring device 10, the flatness or nonflatness of the wafer 1 during the exposure operation. Therefore, before initiation of the exposure operation, the surface shape of the wafer 1 is controlled by the feedback system including the flatness measuring device 10. Upon and after the exposure operation, on the other hand, the flatness measuring device 10 is retracted out of the path of exposure light, and the pressure in the pocket 2b is maintained constant by means of the feedback system including the pressure sensor 5 so as to maintain the desired surface shape of the wafer 1.

As described above, the wafer chuck device of FIG. 1 is arranged to support and hold fixedly the wafer 1 only at the peripheral portion thereof. The pocket 2b formed at the central portion of the wafer chuck is effective to define a closed space or chamber when the wafer 1 is held on the wafer chuck. The pressure in the closed chamber or pocket 2b is controllable to apply, to the mid portion of the wafer 1, an upwardly pressing force or a downwardly attracting force so as to change the surface shape of the wafer 1 into an exactly flat plane or a concave or convex plane having a desired curvature. Accordingly, a desired surface shape of the wafer 1 is attainable. As a result, when a circuit pattern of a mask is to be projected onto a semiconductor wafer, it is possible to preclude any focus error, in the plane of the wafer surface with respect to the image of the circuit pattern, due to any unwanted concave or convex warp of the wafer or the nonflatness of the best focal plane of the projection optical system. Therefore, it is possible to prevent deterioration of the image transfer onto the wafer due to the focus error. Further, the substantial portion of the reverse surface of the wafer is kept in contact with the pressure (positive or negative) and out of contact with the wafer chuck base. As a result, any foreign particle existing between that portion of the wafer and the wafer chuck base does not affect against the focus.

Figure 2:
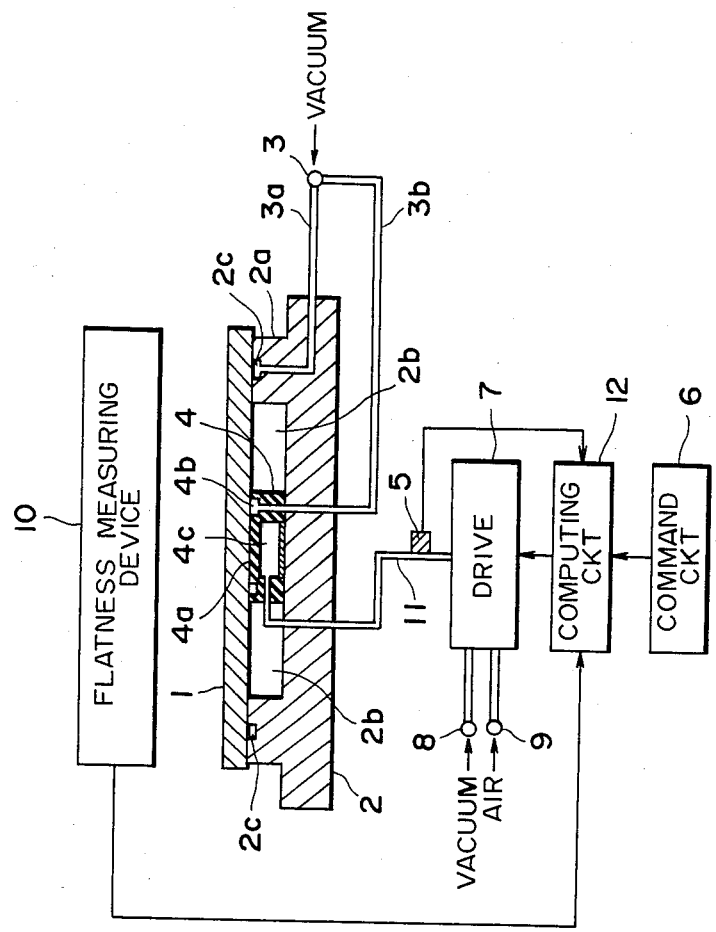
FIG. 2 is a sectional view schematically and diagrammatically showing a surface shape controlling device according to another embodiment of the present invention.

FIG. 2 shows a surface shape controlling device according to another embodiment of the present invention. Since this embodiment includes elements similar to those of the FIG. 1 embodiment, a detailed description of such elements will be omitted here, only for the sake of simplicity, by assigning the same reference numerals to the corresponding elements.

The device of this embodiment includes a diaphragm member 4 disposed substantially at the center of the recess 2b formed inside the annular support 2a of the wafer chuck base 2. The arrangement of the diaphragm member 4 is illustrated in more detail in enlarged sectional views of FIGS. 3A–3C. The diaphragm member 4 has upper and side walls made of an elastic material, as illustrated. An upper surface 4a of the upper wall of the diaphragm member 4 is adapted to contact a central portion of a reverse face of the wafer 1, when the wafer is supported by the support 2a, and serves as an operative surface for the wafer 1. Formed on the top of the diaphragm member 4 is a vacuum groove 4b which extends circumferentially and concentrically with the vacuum groove 2c formed on the support 2a. The vacuum groove 4b is communicated via a tube 3b and a tube 3 with the same vacuum source for the vacuum groove 2c (the groove 2c communicating with the vacuum source via tubes 3a and 3).

The diaphragm member 4 has formed therein a closed space or chamber 4c which is defined by the upper and side walls of the diaphragm member 4 in cooperation with a lower wall 4d made of a resilient material such as a thin metal. The lower wall 4d of the diaphragm member 4 is sealingly coupled to a support shaft 4e which is fixedly secured by a bolt 4f or the like to the wafer chuck base 2. The chamber 4c has a port 4g which is communicated via a tube 11 to the drive unit 7, whereby a controlled vacuum or controlled pressurized-air can be supplied to the chamber 4c from the vacuum source or the air pressure source, in a similar manner as in the FIG. 1 embodiment. The pressure sensor 5 is effective to detect the pressure in the chamber 4c.

When, in operation, the wafer 1 is placed on the support 2a of the wafer chuck base, vacuum is applied to the vacuum groove 2c via the tube 3a, so that the wafer 1, more particularly, the peripheral portion of the reverse surface of the wafer 1 is fixedly held on the support 2a by vacuum suction. Simultaneously therewith, vacuum is also supplied via the tube 3a to the vacuum groove 4b of the diaphragm member 4, so that the upper or operative surface 4a of the diaphragm member 4 intimately contacts the central portion of the reverse surface of the wafer 1. Subsequently, the flatness measuring device 10 measures the surface shape of the wafer 1 and produces an output which is applied to computing circuit 12. As in the FIG. 1 embodiment, the computing circuit 12 compares the output of the flatness measuring device 10 with an output signal from the command circuit 6 designating the desired surface shape, and computes the difference therebetween. The drive unit 7 controls, in accordance with an output of the computing circuit 12, the supply of vacuum or air pressure to the chamber 4c, to change the pressure in the chamber 4c to thereby displace upwardly or downwardly the operative surface 4a of the diaphragm member 4.

The displacement of the operative surface 4a will be described in more detail with reference to FIGS. 3A–3C.

Figure 3A:
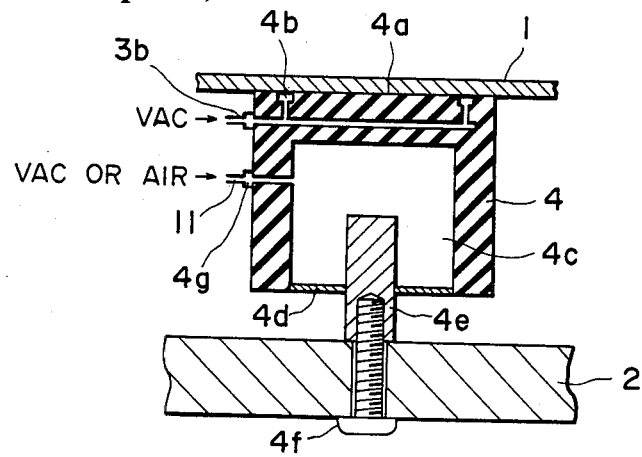
FIGS. 3A–3C are enlarged cross-section showing a diaphram member of the device of FIG. 2.
Figure 3B:
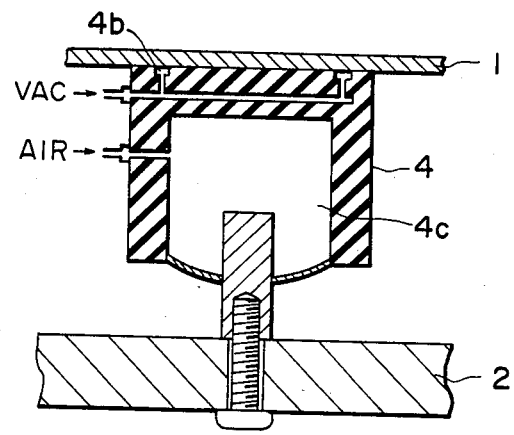
Figure 3C:
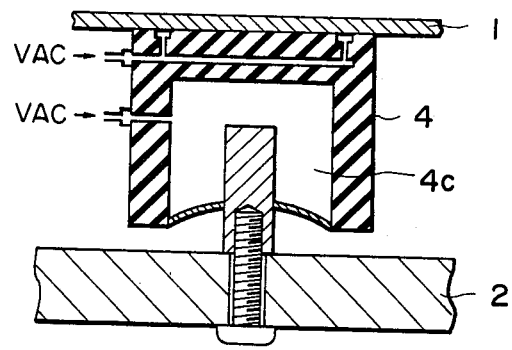

Of FIGS. 3A–3C, FIG. 3A shows the diaphragm member which is in its initial state so that the pressure in the chamber 4c is maintained at the atmospheric pressure. If the wafer 1 is warped concavely which means that the mid portion of the wafer should be deformed upwardly, as viewed in FIG. 3A, a pressurized air is supplied via tube 11 and port 4g into the chamber 4c, so that the pressure in the chamber 4c is increased. While the increasing pressure acts on all the walls of the diaphragm member 4, the lower wall 4d which is deformable most easily is deformed outwardly by this increasing pressure. Since the central portion of the resilient lower wall 4d is coupled, sealingly, to the support shaft 4e which is fixedly secured to the wafer chuck base 2, the outwardly deforming or expanding force of the lower wall 4d is transformed into an upwardly displacing or pressing force to the diaphragm member 4, as will be easily understood from FIG. 3B. The upwardly pressing force applied to the diaphragm member 4 is then applied to the wafer 1, via the operative surface 4a, to urge it upwardly. Of course, a portion of the increasing pressure in the chamber 4c acts on the upper wall of the diaphragm member, which wall is in intimate contact with the lower surface of the wafer 1, so that the upper wall of the diaphragm member 4 and thus the portion of the wafer 1 contacted to the upper wall are urged upwardly. As a result, the portion of the wafer on and around the center thereof is deformed upwardly, as viewed in FIG. 3A or 3B.

If, on the other hand, the wafer 1 is warped convexly which means that the mid portion of the wafer 1 should be deformed downwardly, vacuum is supplied via tube 11 and port 4g into the chamber 4c, so that the pressure in the chamber 4c is decreased. As the result, the lower wall 4d of the diaphragm member 4 is deformed inwardly which causes downward displacement of the diaphragm member 4, such as shown in FIG. 3C. Since the central portion of the lower surface of the wafer is maintained by vacuum suction in intimate contact with the operative surface 4a of the diaphragm member 4, the downward displacement of the diaphragm member 4 causes downward deformation of the portion of the wafer at and around the center thereof.

In this manner, the surface shape of the wafer 1 is changed, as desired, into a flat, concave or convex plane. By repeating in a negative feedback manner the surface shape control comprising control of the pressure within the chamber of the diaphragm member 4 with or without measurement of the flatness of the wafer 1 surface, the surface shape of the wafer 1 is controlled as designated by the command circuit 8.

Similarly to the FIG. 1 embodiment, where the surface shape controlling device of FIG. 2 embodiment is incorporated into a semiconductor device manufacturing exposure apparatus, it is difficult to measure with the flatness measuring device 10 the flatness or nonflatness of the surface of the wafer 1 during the exposure operation. Therefore, before the exposure operation, the surface shape of the wafer 1 is controlled in the manner described above and, on the other hand, upon the exposure operation, the flatness measuring device 10 is retracted out of the path of exposure light and the supply pressure (positive or negative) to the diaphragm member 4 is maintained constant by feedback control using the output of the pressure sensor 5, thereby maintain the deformation of the diaphragm member 4.

As described, the wafer chuck device of FIG. 2 is arranged to support and hold fixedly the wafer 1 only at the peripheral portion thereof. Also, the diaphragm member 4 having a pressure-controllable chamber is provided substantially at the central portion of the wafer chuck base. The pressure within the chamber of the diaphragm member is controlled so as to upwardly or downwardly displace the central portion of the wafer to thereby correct the surface shape of the wafer into an exactly flat plane or a concave or convex plane having a desired curvature. As a result, when a circuit pattern of a mask is to be projected onto the wafer by means of a projection optical system of the exposure apparatus, it is possible to preclude any focus error, in the plane of the wafer surface with respect to the image of the circuit pattern, due to any unwanted concave or convex warp of the wafer or due to nonflatness of the best focal plane of the projection optical system. Therefore, it is possible to prevent deterioration of image transfer onto the wafer due to the focus error. Since the surface shape of the wafer is controlled by means of a diaphragm member having a smaller closed chamber or space, the time required for deforming the wafer is decreased as compared with that required in the FIG. 1 embodiment.

Figure 4A:
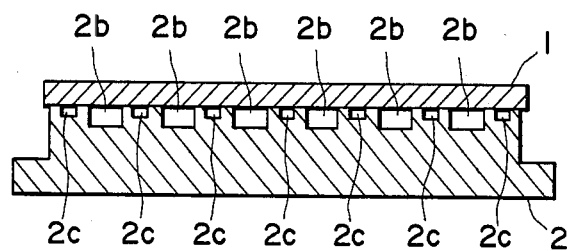
FIGS. 4A–4C are sectional views showing respectively modified forms of surface shape controlling devices of the present invention.

The surface shape controlling device of the present invention can be modified in various manners. For example, while each of the foregoing embodiments has a single pocket (such as at 2b) and a single vacuum groove (such as at 2c), the device may have a plurality of pockets and vacuum grooves such as shown at 2b—2b and 2c—2c in FIG. 4A. In this embodiment, a plurality of annular pockets 2b—2b and a plurality of annular vacuum grooves 2c—2c are provided concentrically and alternately. Each of the pockets 2b—2b is connected to its own feedback system, so that the surface shape of the wafer 1 is controlled at plural points. With such arrangement, the surface shape can be controlled more precisely. Further, each of the pockets 2b—2b may have a diaphragm member such as at 4 in FIG. 2 embodiment. Substantially the same effects are attainable with such arrangement.

Figure 4B:
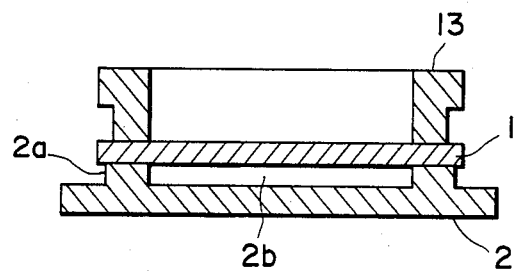
Figure 4C:
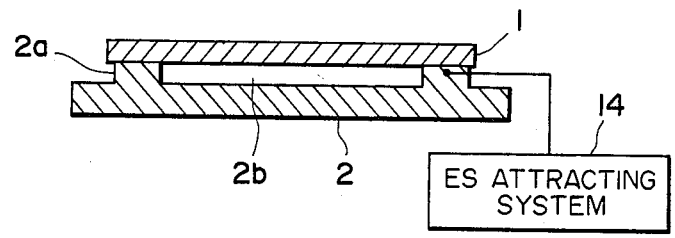

While, in the foregoing embodiments, the wafer is held on the wafer chuck by vacuum suction, the wafer may be held mechanically such as shown in FIG. 4B. In this example, the wafer 1 is held on the support 2a of the wafer chuck base 2 by a keep member 13 which is opposed to the upper surface of the wafer 1. It is a possible alternative to use an electrically attracting system such as an electrostatically attracting system 14 shown in FIG. 4C to electrically charge the support 2a of the wafer chuck base to thereby attractingly hold the peripheral portion of the wafer 1. The arrangements of FIG. 4B and 4C are preferable in the point that a larger fixing force is available relative to wafer, such that the pressure within the pocket 2b can be made higher as compared with that of the FIG. 1 embodiment. This leads to a wider range of control of the surface shape.

As a further alternative, the pressure within the closed space or chamber 4c of the diaphragm member 4 of the FIG. 2 embodiment may be changed by the driving unit 7 into one other than the atmospheric pressure, before applying the vacuum to the vacuum groove 4b, so as to preparatively deform the diaphragm 4 by a predetermined amount. After such preparative deformation of the diaphragm member 4, the vacuum is applied to the vacuum groove 4b so as to bring the operative surface 4a into intimate contact with the lower surface of the wafer 1. In such case, it is possible to displace the diaphragm member 4 in a desired direction (upwardly or downwardly) by changing the set pressure in the closed chamber 4c toward the atmospheric pressure or away from the atmospheric pressure. Therefore, the drive unit 7 may be connected only one of the vacuum source and the air pressure source.

While the invention has been described with reference to the structures disclosed herein, it is not confined to the details set forth and this application is intended to cover such modifications or changes as may come within the scope of the following claims.

What is claimed is:

1. A device for controlling the shape of a surface of a plate-like member, said device comprising:
   means for supporting the plate-like member from a reverse surface thereof;
   means for holding a portion of the reverse surface of the plate-like member on said supporting means; and
   controlling means for controlling a pressure in a closed space which is related, when the plate-like member is supported by said supporting means, to a portion of the reverse surface of the plate-like member other than the first-mentioned portion, such that the pressure in said closed space is changeable to be increased or decreased as compared with an initial pressure in said closed space when the plate-like member is supported by said supporting means, to control deformation of the plate-like member to thereby control the surface shape of the plate-like member;
   wherein said controlling means includes a diaphragm member for defining said closed space.

2. A device according to claim 1, wherein said diaphragm member is disposed between said supporting means and the portion of the reverse surface of the plate-like member other than said first-mentioned portion when the plate-like member is supported by said supporting means.

3. A device according to claim 2, wherein said controlling means includes means for bringing said diaphragm member into intimate contact with the portion of the reverse surface of the plate-like member other than said first-mentioned portion.

4. A device for controlling the shape of a surface of a wafer, when a pattern of a mask prepared for manufacture of a semiconductor device is to be projected onto the wafer, said device comprising:
   means for supporting the wafer from a reverse surface thereof;
   means for holding a portion of the reverse surface of the wafer on said supporting means;
   controlling means for controlling a pressure in a closed space which is related, when the wafer is supported by said supporting means, to a portion of the reverse surface of the wafter other than the first-mentioned portion, such that the pressure in said closed space is changeable to be increased or decreased as compared with an initial pressure in said closed space when the wafer is supported by said supporting means, so as to bring the surface of the wafer into a predetermined relation with a plane in which an image of the pattern of the mask is to be formed;
   wherein said controlling means includes a diaphragm member for defining said closed space.

5. A device for controlling the shape of a surface of a plate-like member, said device comprising:
   means for supporting the plate-like member from a reverse surface thereof;

means for holding a first portion of the reverse surface of the plate-like member on said supporting means;

means for producing a positive and/or negative pressure; and deforming means for receiving the positive or negative pressure produced by said producing means and for applying, to a second portion of the reverse surface of the plate like member which portion is other than said first portion, a pressing or attracting force caused by the positive or the negative pressure to deform the plate-like member to thereby control the surface shape of the plate-like member.

6. A device according to claim 5, wherein said deforming means includes a pressure controllable chamber defined between said supporting means and the plate-like member when the latter is held on the former, said chamber receiving the positive or negative pressure produced by said producing means to apply the pressing or attracting force to said second portion of the reverse surface of the plate-like member, and wherein said deforming means further includes means for controlling the pressure in said chamber to control the pressing or attracting force to be applied to the plate-like member.

7. A device according to claim 5, wherein said deforming means includes a force applying member for applying the pressing or attracting force to said second portion of the reverse surface of the plate-like member, said force applying member having a pressure-controllable chamber formed therein for receiving the positive or negative pressure produced by said producing means to transfer it into the pressing or attracting force, and wherein said deforming means further includes means for controlling the pressure in said chamber to control the pressing or attracting force to be applied to the plate-like member.

* * * * *

UNITED STATES PATENT AND TRADEMARK OFFICE
CERTIFICATE OF CORRECTION

PATENT NO. : 4,737,824

DATED : April 12, 1988

INVENTOR(S) : FUMIO SAKAI, ET AL.

It is certified that error appears in the above-identified patent and that said Letters Patent is hereby corrected as shown below:

COLUMN 2

Line 12, "foregin" should read --foreign--.
    Line 13, "platelike" should read --plate-like--.
    Line 51, "cross-section" should read --cross-sections--.

COLUMN 3

Line 25, "municated" should read --municates--.
    Line 26, "pump)" should read --pump),--.

COLUMN 4

Line 19, "flatened" should read --flattened--.
    Line 65, "against" should be deleted.

COLUMN 5

Line 2, "here, only" should read --here--.

COLUMN 6

Line 62, "tain" should read --taining--.

COLUMN 7

Line 48, "FIG. 4B and 4C" should read --FIGS. 4B and 4C--.

UNITED STATES PATENT AND TRADEMARK OFFICE
CERTIFICATE OF CORRECTION

PATENT NO.  : 4,737,824　　　　　　　　　　　Page 2 of 2

DATED       : April 12, 1988

INVENTOR(S) : FUMIO SAKAI, ET AL.

It is certified that error appears in the above-identified patent and that said Letters Patent is hereby corrected as shown below:

COLUMN 8

Line 1, "connected" should read --connected to--.
    Line 53, "wafter" should read --wafer--.

COLUMN 9

Line 9, "plate like" should read --plate-like--.
    Line 15, "pressure controllable" should read --pressure-controllable--.

Signed and Sealed this

Twenty-ninth Day of November, 1988

*Attest:*

DONALD J. QUIGG

*Attesting Officer*　　　　　　　　　*Commissioner of Patents and Trademarks*